US008906758B2

(12) United States Patent
Urteaga (10) Patent No.: US 8,906,758 B2
(45) Date of Patent: Dec. 9, 2014

(54) REGROWN HETEROJUNCTION BIPOLAR TRANSISTORS FOR MULTI-FUNCTION INTEGRATED DEVICES AND METHOD FOR FABRICATING THE SAME

(75) Inventor: Miguel E. Urteaga, Moorpark, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 237 days.

(21) Appl. No.: 12/955,171

(22) Filed: Nov. 29, 2010

(65) Prior Publication Data
US 2012/0132960 A1    May 31, 2012

(51) Int. Cl.
| | | |
|---|---|---|
| H01L 21/338 | (2006.01) | |
| H01L 21/8252 | (2006.01) | |
| H01L 27/06 | (2006.01) | |
| H01L 29/08 | (2006.01) | |
| H01L 29/737 | (2006.01) | |

(52) U.S. Cl.
CPC ........ H01L 21/8252 (2013.01); H01L 27/0605 (2013.01); H01L 29/0821 (2013.01); H01L 29/7371 (2013.01)
USPC .................. 438/170; 438/172; 257/E21.093; 257/E21.103; 257/E21.188; 257/E21.371; 257/E21.387

(58) Field of Classification Search
USPC .................. 257/E21.093, E21.103, E21.188, 257/E21.371, E21.387; 438/170, 172
See application file for complete search history.

(56) References Cited

U.S. PATENT DOCUMENTS

| | | | |
|---|---|---|---|
| 7,576,409 B1 * | 8/2009 | Chen et al. ..................... | 257/560 |
| 7,592,648 B2 * | 9/2009 | Bottner et al. ................ | 257/197 |
| 2005/0199909 A1 * | 9/2005 | Murayama et al. ........... | 257/197 |

FOREIGN PATENT DOCUMENTS

EP            541205 A2 *   5/1993

* cited by examiner

*Primary Examiner* — Robert Huber
(74) *Attorney, Agent, or Firm* — Snell & Wilmer LLP

(57) ABSTRACT

The present invention may provide an integrated device, which may include a substrate having first and second regions, the first region spaced apart from the second region, a first heterojunction bipolar transistor (HBT) device formed on the first region of the substrate, the first HBT device having a first collector layer formed above the first region of the substrate, the first collector layer having a first collector thickness and a first collector doping level, and a second HBT device formed on the second region of the substrate, the second HBT device having a second collector layer formed above the second region of the substrate, the second collector layer having a second collector thickness and a second collector doping level, the second collector thickness substantially greater than the first collector thickness, the second collector doping level lower than the first collector doping level.

16 Claims, 8 Drawing Sheets

REGROWN HETEROJUNCTION BIPOLAR TRANSISTORS FOR MULTI-FUNCTION INTEGRATED DEVICES AND METHOD FOR FABRICATING THE SAME

BACKGROUND

1. Field

The present invention relates generally to the field of regrown bipolar transistors, and more particularly to regrown heterojunction bipolar transistors (HBT) for multi-function integrated circuits and method for fabricating the same.

2. Description of the Related Art

Compared to conventional silicon-based homojunction bipolar junction transistors (BJT), a heterojunction bipolar transistor (HBT) may have an emitter layer with a larger bandgap and a base layer with a smaller bandgap. The larger bandgap emitter layer may provide a better barrier for hole injection, which may be initiated from the base layer. Accordingly, the base layer may be doped at a higher doping level, thereby lowering the base resistance and improving the radio frequency (RF) performance of the HBT.

For conventional silicon-based homojunction BJT, the collector doping may be performed by an ion implantation process, which may allow the collector layers of various BJT devices to be formed on a single substrate and have different doping profiles. Attempts have been made in the past to adopt the ion implantation process for performing the collector doping of the compound semiconductor HBT devices in the Indium Phosphide and Gallium Arsenide material systems. However, due to various technical issues, the ion implantation process is generally not used for collector doping of these compound semiconductor HBT devices.

Accordingly, the collector doping of HBT devices may be performed by an epitaxial growth process. Currently, the epitaxial growth process may allow growing HBT devices with a single collector doping profile on a single substrate. In order to develop HBT devices with multiple collector doping profiles, at least two substrates may be needed. However, multiple substrates may lead to additional parasitic effects and inter-chip routing. As such, it may become inefficient for multi-function integrated devices to have multiple HBT devices with different collector doping profiles.

Thus, there is a need to provide a single chip solution to grow and regrow multiple HBT devices for multi-function integrated devices.

SUMMARY

In one embodiment, the present invention may provide an integrated device, which may include a substrate having first and second regions, the first region spaced apart from the second region, a first heterojunction bipolar transistor (HBT) device formed on the first region of the substrate, the first HBT device having a first collector layer formed above the first region of the substrate, the first collector layer having a first collector thickness and a first collector doping level, and a second HBT device formed on the second region of the substrate, the second HBT device having a second collector layer formed above the second region of the substrate, the second collector layer having a second collector thickness and a second collector doping level, the second collector thickness substantially greater than the first collector thickness, the second collector doping level lower than the first collector doping level.

In another embodiment, the present invention may provide an integrated device, which may include a substrate having first and second regions, the first region spaced apart from the second region, a first heterojunction bipolar transistor (HBT) device formed on the first region of the substrate, the first HBT device having a first base layer formed above the first region of the substrate, the first base layer having a first base doping level, and a second HBT device formed on the second region of the substrate, the second HBT device having a second base layer formed above the second region of the substrate, the second base layer having a second base doping level, the second base doping level higher than the first base doping level.

In another embodiment, the present invention may provide a method for fabricating an integrated device, which may have a first heterojunction bipolar transistor (HBT) device formed on a first region of a substrate and a second HBT device formed on a second region of the substrate, and in which the first region may be spaced apart from the second region. The method may include the steps of depositing a first collector layer above the first and second regions of the substrate, the first collector layer having a first collector thickness and a first collector doping level, etching the first collector layer above the second region of the substrate, and depositing a second collector layer above the second region of the substrate, the second collector layer having a second collector thickness and a second collector doping level, the second collector thickness substantially greater than the first collector thickness, the second collector doping level lower than the first collector doping level.

In yet another embodiment, the present invention may provide a method for fabricating an integrated device, which may have a first heterojunction bipolar transistor (HBT) device formed on a first region of a substrate and a second HBT device formed on a second region of the substrate, and in which the first region may be spaced apart from the second region. The method may include the steps of depositing a first base layer above the first and second regions of the substrate, the first base layer having a first base doping level, etching the first base layer above the second region of the substrate, and depositing a second base layer above the second region of the substrate, the second base layer having a second base doping level, the second base doping level higher than the first base doping level.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Apparatus, systems and methods that implement the embodiment of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between reference elements. In addition, the first digit of each reference number indicates the figure in which the element first appears.

Throughout this disclosure, the term "processing" in the context of forming a wafer layer includes, but is not limited to, coating a layer with insulating or conductive material using a deposition process, patterning a layer using a masking or etching process, preparing the layer for bonding by depositing bond pads such as gold bond pads onto the surface of a layer, and/or removal of material from or complete removal of one or more layers of a wafer.

FIGS. 1A-1F schematically show the steps of growing a first heterojunction bipolar transistor (HBT) structure 100 on a substrate 110 according to an embodiment of the present invention. Generally, an HBT structure may include various semiconducting layers, such as a subcollector layer, a collector layer, a base layer, and an emitter layer. Once the HBT structure is fabricated, it may be further processed to form an HBT device. Particularly, the HBT devices discussed herein may be formed by various group III-V semiconducting layers, each of which may include one or more group III-V materials.

A group III-V material may be a compound with at least one group III element and one group V element from the periodic table. For example, each of the subcollector layer, the collector layer, the base layer, and the emitter layer of the HBT device may include gallium arsenide (GaAs), indium gallium arsenide (InGaAs), aluminum gallium arsenide (AlGaAs), indium gallium phosphide (InGaP), indium phosphide (InP), indium aluminum arsenide (InAlAs), indium arsenide (InAs), and/or gallium arsenide antimonide (GaAsSb).

Figure 1A:
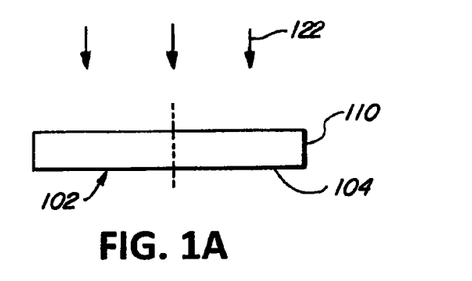
FIGS. 1A-1F schematically show the steps of growing a first heterojunction bipolar transistor (HBT) structure on a substrate according to an embodiment of the present invention.

As shown in FIG. 1A, the substrate 110 may have a first region 102 and a second region 104. Generally, the first region 102 may be used for forming a first HBT device, and the second region 102 may be used for forming a second HBT device. In order to separate the first and second HBT devices, the first region 102 may be spaced apart from the second region 104. Alternatively, the first region 102 may be adjacent to the second region 104 such that the first region 102 may be free of overlapping with the second region 104.

The substrate 110 may be any type of substrate that is suitable for growing group III-V semiconductor layers to form various HBT devices. For example, the substrate 110 may include one or more group III-V compounds, such as gallium arsenide (GaAs), Indium Phosphide (InP), and/or Gallium Antimonide (GaSb).

Figure 1B:
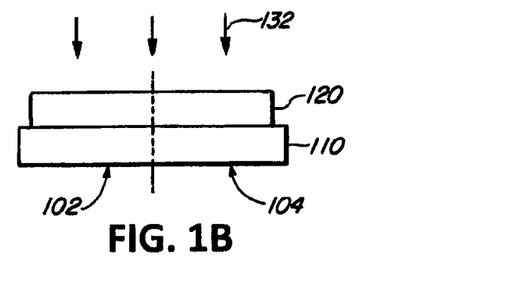
Figure 1C:
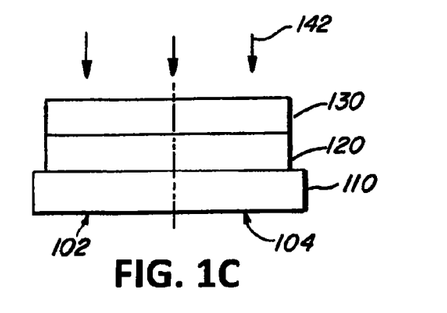

Initially, a first subcollector material 122 may be deposited on the surface of the substrate 110, which may cover both the first and second regions 102 and 104. As shown in FIG. 1B, a first subcollector layer 120 may then be grown on the substrate 110. After the first subcollector layer 120 is formed, a first collector material 132 may be deposited on the surface of the first subcollector layer 120. As shown in FIG. 1C, a first collector layer 130 may then be grown on the first subcollector layer 120.

Generally, the characteristics of the HBT device may be defined by the thickness and doping level of the collector layer thereof. For example, the HBT device may have the characteristics of a high breakdown device when the collector layer has a relatively large thickness but a relatively low doping level. For another example, the HBT device may have the characteristics of a high speed device when the collector layer has a relatively small thickness but a relatively high doping level. Accordingly, the characteristics of the first HBT device may be adjusted and fine tuned by controlling the thickness and doping level of the first collector layer 130.

Figure 1D:
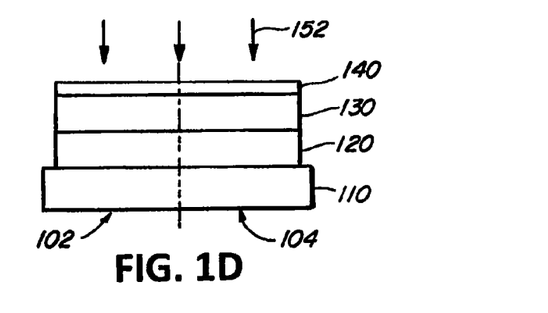

After the first collector layer 130 is formed, a first base material 142 may be deposited on the surface of the first collector layer 130. As shown in FIG. 1D, a first base layer 140 may then be grown on the first collector layer 130. Generally, at frequencies much lower than the transistor cutoff frequency, the noise figure of the HBT device may be controlled by its current gain (beta $\beta$), which may be adjusted by varying the doping level of the base layer of the HBT device. That is, the low frequency noise figure of the HBT device may be controlled by adjusting the doping level of the base layer. For example, the HBT device with a lightly doped base layer may be used as a low noise HBT device.

Figure 1E:
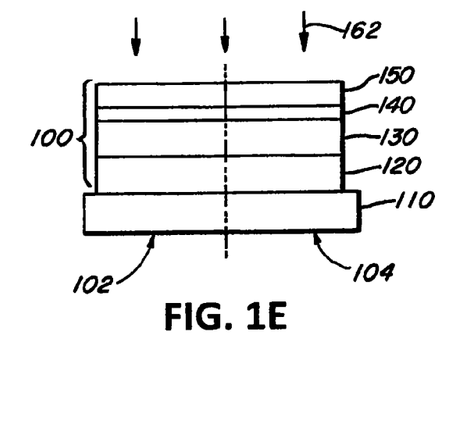

After the first base layer 140 is formed, a first emitter material 152 may be deposited on the surface of the first base layer 140. As shown in FIG. 1E, a first emitter layer may then be grown on the first base layer 140. At this stage, the first HBT structure 100 is formed on top of the first and second regions 102 and 104 of the substrate 110. Before regrowing a second HBT structure, a portion of the first HBT structure may be removed from the space above the second region 104 of the substrate 110.

Figure 1F:
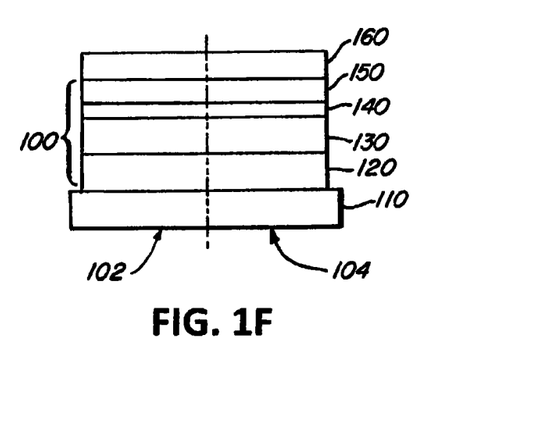

Accordingly, a hard mask material 162 may be deposited on top of the first emitter layer 150 as shown in FIG. 1E. Generally, the hard mask material 162 may be any masking material that may withstand a regrowth temperature, which may range from about 400° C. to about 600° C. In one embodiment, for example, the hard mask material 162 may include silicon nitride (SiN). In another embodiment, for example, the hard mask 162 may include silicon oxide (SiO). Particularly, the hard mask material 162 may be deposited on the first emitter layer 150 by using plasma enhanced chemical vapor deposition (PECVD) method or other similar deposition methods. As shown in FIG. 1F, the hard mask layer 160 may substantially cover the entire first HBT structure 100, which may in return cover the first and second regions 102 and 104 of the substrate 110.

Figure 2A:
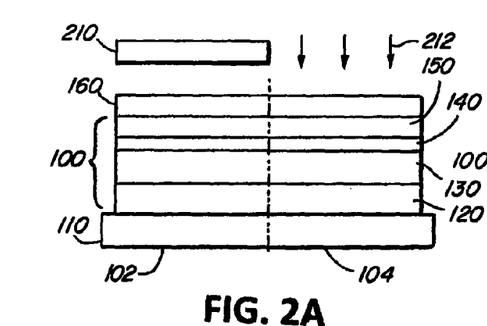
FIGS. 2A-2F schematically show the steps of regrowing a second HBT structure on the substrate according to an embodiment of the present invention.

FIGS. 2A-2E schematically show the steps of regrowing a second HBT structure 200 on the substrate 110 according to an embodiment of the present invention. Referring to FIG. 2A, the hard mask 160 may be patterned by a lithographic process. Initially, a patterned photoresist layer 210 may be placed above the hard mask layer 160, such that an opening of the patterned photoresist layer 210 may be spatially aligned with the second region 104 of the substrate 110. As such, a portion of the hard mask layer 160 may be shielded by the patterned photoresist layer 210 while another portion of the hard mask layer 160 may be unshielded. The unshielded portion of the hard mask layer 160 may then be etched away by a reactive ion etch process 212 or other similar process(es).

Figure 2B:
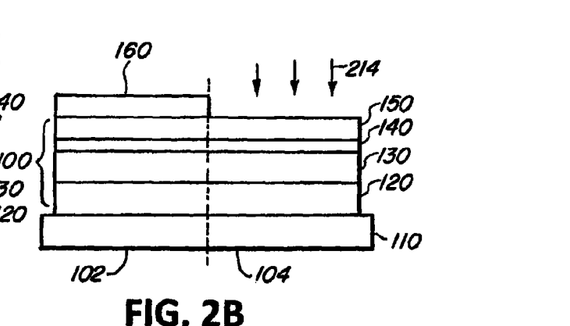

As shown in FIG. 2B, the partially etched hard mask layer 160 may expose a portion of the first emitter layer directly above the second region 104 of the substrate 110. To remove the stack of first HBT layers grown on top of the second region 104 of the substrate 110, a chemical etch process 214 may be performed. In one embodiment, for example, the chemical etch process 214 may be a wet chemical etch process. In another embodiment, for example, the chemical etch process 214 may be a reactive ion etch process.

Figures 2C, 2D:
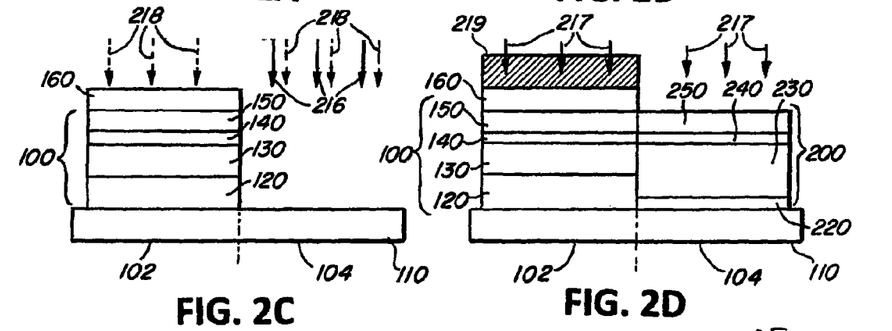

After the chemical etch process 214 is performed, the first subcollector layer 120, the first collector layer 130, the first base layer 140, and the first emitter layer 150 may be removed from the surface of the second region 104 of the substrate 110 as shown in FIG. 2C. At this stage, the space above the second region 104 of the substrate 110 may be vacant and ready for a regrowth of the second HBT structure. The regrowth process may be selective or non-selective. In one embodiment, for example, the regrowth of the second HBT structure may be, selectively performed by a metal organic chemical vapor deposition (MOCVD) process 216. In another embodiment, for example, the regrowth of the second HBT structure may be non-selectively performed by a molecular beam epitaxy (MBE) process 218.

Referring to FIG. 2D, the second HBT structure 200 may be regrown on the second region 104 of the substrate 110. Similarly to the first HBT structure 100, the second HBT structure may include a second subcollector layer 220, a second collector layer 230, a second base layer 240, and a second emitter layer 250. More specifically: a second subcollector material may be deposited on the second region 104 of the substrate 110, so that the second subcollector layer 220 may be grown thereon; a second collector material may be deposited on the second subcollector layer 220, so that the second collector layer 230 may be grown thereon; a second base material may be deposited on the second collector layer 230, so that the second base layer 240 may be grown thereon; and a second emitter material may be deposited on the second base layer 240, so that the second emitter layer 250 may be grown thereon.

When the non-selective MBE process 218 is used for regrowing the second HBT structure, a polycrystalline epitaxy 219 may be formed on top of the un-etched hard mask layer 160. After the second HBT structure 200 is properly regrown, a hard mask etching process 217 may be performed to remove the remaining hard mask layer 160 and the polycrystalline epitaxy 219. The hard mask etching process 217 may be similar to the process 212 as shown in FIG. 2A. However, instead of shielding the first region 120, the hard mask etching process may apply the patterned photoresist layer 210 to shield the second HBT structure 200 during the reactive ion etch process. Alternatively, the hard mask etching process 217 may be selectively performed by focusing the reactive ion etch process in an area above the first region 102 of the substrate 110. As such, the remaining hard mask layer 160 and the polycrystalline epitaxy 219 may be removed without damaging the first and second HBT structures 100 and 200.

Figure 2E:
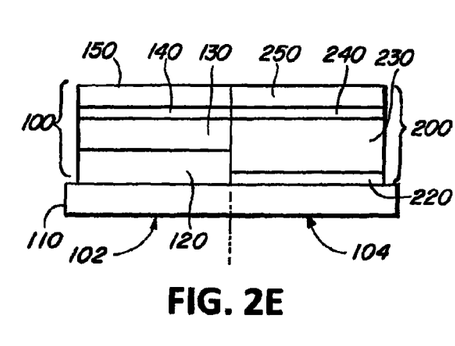

As shown in FIG. 2E, the first and second HBT structures 100 and 200 may include similar layers with similar group III-V materials such as gallium arsenide (GaAs), indium gallium arsenide (InGaAs), aluminum gallium arsenide (AlGaAs), indium gallium phosphide (InGaP), indium phosphide (InP), indium aluminum arsenide (InAlAs), indium arsenide (InAs), and/or gallium arsenide antimonide (GaAsSb). Moreover, the regrowth process may be controlled and fine tuned such that the first and second HBT structures 100 and 200 may have a same overall thickness according to an embodiment of the present invention.

Despite their structural similarities, the first and second HBT structures 100 and 200 may have different semiconducting characteristics. In one embodiment, for example, the first HBT structure 100 may have a different cut-off frequency and/or breakdown voltage from the second HBT structure 200 because the first collector layer 130 may have a different thickness and doping level from the second collector layer 230. In another embodiment, for example, the first HBT structure 100 may have a reduced frequency noise figure from the second HBT structure 200 because the first base layer 140 may have a different doping level and a different current gain (beta) from the second base layer 240.

For illustrative purposes, the second collector layer 230 may be substantially thicker than the first collector layer 130, and it may have a lower doping level than the first collector layer 130. Accordingly, the second HBT structure 200 may have a higher breakdown voltage than the first HBT structure 100, but at the same time, the second HBT structure 200 may have a lower cut-off frequency than the first HBT structure 100.

Because the thickness of the subcollector layer generally does not impact the performance of the HBT device, the regrowth process may substantially adjust the thickness of the second subcollector layer 220 to compensate the increased or decreased thickness of the second collector layer 230. Consequentially, the overall thickness of the second HBT structure 200 (i.e., the second device thickness) may be substantially equal to the overall thickness of the first HBT structure 100 (i.e. the first device thickness). As a person skilled in the art may readily appreciate, maintaining a uniform thickness across the first (original) and second (regrown) HBT structures 100 and 200 may be advantageous because it may reduce the amount of process steps and/or process errors in forming the subsequent first and second HBT devices.

Figure 2F:
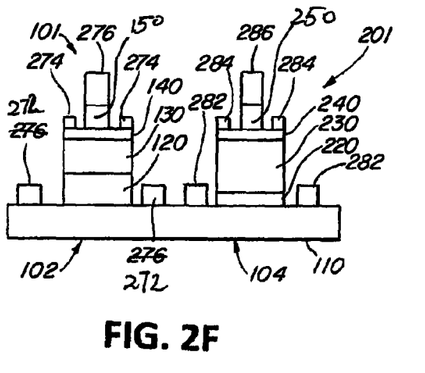

As shown in FIG. 2F, the first HBT structure 100 may be further processed to form a first HBT device 101, and the second HBT structure 200 may be further processed to form a second HBT device 201. Referring to the first HBT device 101, the first emitter layer 150 may be coupled to a first emitter electrode 276, the first base layer 140 may be coupled to two first base electrodes 274, and the first collector layer 130 may be coupled to two first collector electrodes 272.

Referring to the second HBT device 201, the second emitter layer 250 may be coupled to a second emitter electrode 286, the second base layer 240 may be coupled to two second base electrodes 284, and the second collector layer 130 may be coupled to two second collector electrodes 282.

Because the second collector layer 230 may be thicker and may have a lower doping level than the first collector layer 130, the second HBT device 201 may possess the characteristics of a high breakdown device while the first HBT device 201 may possess the characteristics of a high frequency device. Generally, the high breakdown device may be used in a high power amplifier circuit, such as a high power radio frequency (RF) circuit, and the high frequency device may be used in a high speed circuit, such as a high speed digital switching circuit.

Accordingly, the present invention may provide an integrated device with an originally grown HBT device and a regrown HBT device. Moreover, the present invention may provide a process for regrowing multiple HBT devices with various semiconducting properties on a single substrate. Advantageously, the present invention may help integrate devices with different functionalities into a single chip, such that the amount of inter-chip routing and the area of multi-functional circuitries may be substantially reduced.

Figure 3:
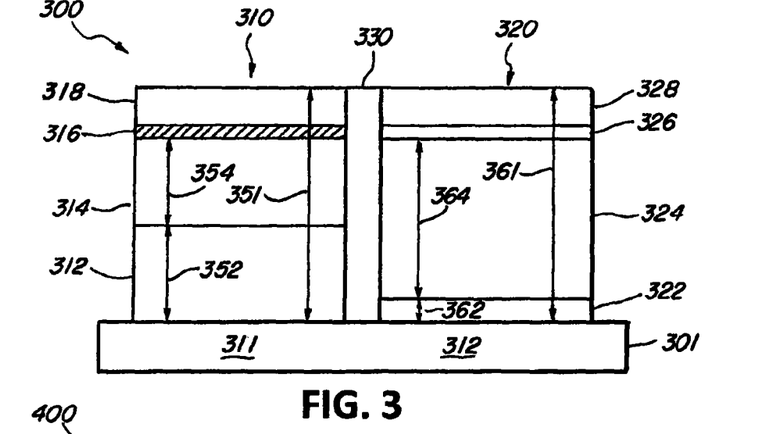
FIG. 3 shows a cross-sectional schematic view of an integrated device with a low noise HBT structure and a high breakdown HBT structure according to an embodiment of the present invention.

The discussion now turns to various integrated devices, each of which may have two or more different HBT devices. In FIG. 3, a cross-sectional schematic view of an integrated device 300 with a low noise HBT structure 310 and a high breakdown HBT structure 320 is shown according to an embodiment of the present invention. Generally, the low noise HBT structure 310 may be originally grown on a first region 311 of the substrate 301, and the high breakdown HBT structure 320 may be regrown on a second region 321 of the substrate 301. Alternatively, the high breakdown HBT structure 320 may be originally grown on a first region 311 of the substrate 301, and the low noise HBT structure 310 may be regrown on a second region 321 of the substrate 301.

Optionally, an insulating barrier 330 may be formed between the low noise HBT structure 310 and the high breakdown HBT structure 320. The insulating barrier 330 may shield the originally grown low noise HBT structure 310 during the regrowth of the high breakdown HBT structure 320, so as to prevent semiconductor sidewall growth of the high breakdown HBT structure 320 onto the originally grown low noise HBT structure 310.

The low noise HBT structure 310 may have a lightly doped base layer 316, and it may be further processed to form a low noise device, which may generally have a high current gain ($\beta$). In one embodiment, for example, the current gain of the low noise device may be greater than at least 40. In another embodiment, for example, the current gain of the low noise device may be greater than at least 80.

Moreover, the low noise HBT structure 310 may have a subcollector layer 312, a collector layer 314, and an emitter layer 318. In addition to its low noise characteristic, the low noise HBT structure 310 may acquire other semiconducting characteristics by adjusting the collector layer 314. In one embodiment, for example, the collector layer 314 may have a collector thickness 354, which may be increased to enhance the breakdown voltage of the low noise HBT structure 310. In another embodiment, for example, the collector thickness 354 may be decreased to enhance the cutoff frequency of the low noise HBT structure 310.

The subcollector layer 312 may have a subcollector thickness 352, which may be used for compensating the adjustment made to the collector thickness 354. As a result, the combined device thickness 351 of the low noise HBT structure 310 may be kept constant.

The high breakdown HBT structure 320 may have a lightly doped collector layer 324, and it may be further processed to form a high breakdown device. The collector layer 324 may have a collector thickness 364, which may be greater than the collector thickness 354 of the low noise HBT structure 310. As such, the high breakdown HBT structure 320 may have a higher breakdown voltage than the low noise HBT structure 310. In one embodiment, the breakdown voltage of the high breakdown HBT structure 320 may range, for example, from about 5 V to about 10 V. In another embodiment, the breakdown voltage of the high breakdown HBT structure 320 may be greater than about 7.5 V.

The subcollector layer 322 may have a subcollector thickness 362, which may be used for compensating the adjustment made to the collector thickness 364. As a result, the combined device thickness 361 of the high breakdown HBT structure 320 may be kept constant. Therefore, the combined device thickness 351 of the low noise HBT structure 310 may be substantially the same as the combined device thickness 361 of the high breakdown HBT structure 320.

Figure 4:
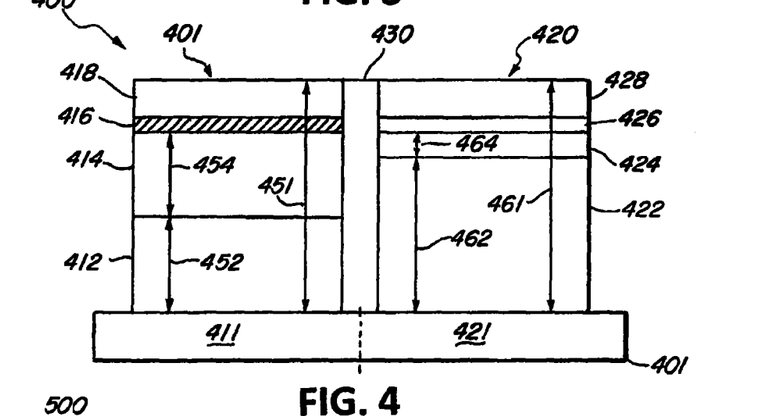
FIG. 4 shows a cross-sectional schematic view of an integrated device with a low noise HBT structure and a high speed HBT structure according to an embodiment of the present invention.

In FIG. 4, a cross-sectional schematic view of an integrated device 400 with a low noise HBT structure 410 and a high speed HBT structure 420 is shown according to an embodiment of the present invention. Generally, the low noise HBT structure 410 may be originally grown on a first region 411 of the substrate 401, and the high speed HBT structure 420 may be regrown on a second region 421 of the substrate 401. Alternatively, the high speed HBT structure 420 may be originally grown on a first region 411 of the substrate 401, and the low noise HBT structure 410 may be regrown on a second region 421 of the substrate 401.

Optionally, an insulating barrier 430 may be formed between the low noise HBT structure 410 and the high speed HBT structure 420. The insulating barrier 430 may shield the originally grown low noise HBT structure 410 during the regrowth of the high speed HBT structure 420, so as to prevent semiconductor sidewall growth of the high speed HBT structure 420 onto the originally grown low noise HBT structure 410.

The low noise HBT structure 410 may be similar to the low noise HBT structure 310. For example, the low noise HBT structure 410 may have a lightly doped base layer 416, and it may be further processed to form a low noise device, which may generally have a high current gain ($\beta$). In one embodiment, for example, the current gain of the low noise device may be greater than at least 40. In another embodiment, for example, the current gain of the low noise device may be greater than at least 80.

Moreover, the low noise HBT structure 410 may have a subcollector layer 412, a collector layer 414, and an emitter layer 418. In addition to its low noise characteristic, the low noise HBT structure 410 may acquire other semiconducting characteristics by adjusting the collector layer 414. In one embodiment, for example, the collector layer 414 may have a collector thickness 454, which may be increased to enhance the breakdown voltage of the low noise HBT structure 410. In another embodiment, for example, the collector thickness 454 may be decreased to enhance the cutoff frequency of the low noise HBT structure 410.

The subcollector layer 412 may have a subcollector thickness 452, which may be used for compensating the adjustment made to the collector thickness 454. As a result, the combined device thickness 451 of the low noise HBT structure 410 may be kept constant.

The high speed HBT structure 420 may have a highly doped collector layer 424, and it may be further processed to form a high speed device. The collector layer 424 may have a collector thickness 464, which may be less than the collector thickness 454 of the low noise HBT structure 410. As such, the high speed HBT structure 420 may have a higher cutoff frequency than the low noise HBT structure 310. In one embodiment, the current gain cutoff frequency of the high speed HBT structure 320 may, for example, be greater than about 300 GHz. In another embodiment, the current gain cutoff frequency of the high speed HBT structure 320 may, for example, be greater than about 500 GHz.

The subcollector layer 422 may have a subcollector thickness 462, which may be used for compensating the adjustment made to the collector thickness 464. As a result, the combined device thickness 461 of the high breakdown HBT structure 420 may be kept constant. Therefore, the combined device thickness 451 of the low noise HBT structure 410 may be substantially the same as the combined device thickness 461 of the high speed HBT structure 420.

Figure 5:
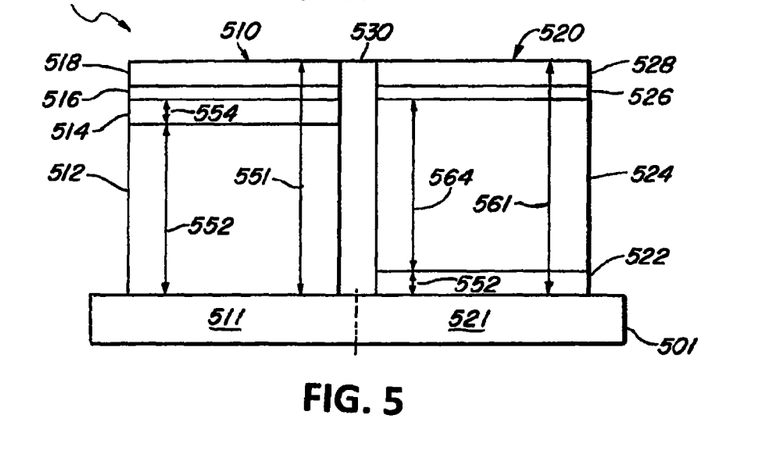
FIG. 5 shows a cross-sectional schematic view of an integrated device with a high speed HBT structure and a high breakdown HBT structure according to an embodiment of the present invention.

In FIG. 5, a cross-sectional schematic view of an integrated device 500 with a high speed HBT structure 510 and a high breakdown HBT structure 520 is shown according to an embodiment of the present invention. Generally, the high speed HBT structure 510 may be originally grown on a first region 511 of the substrate 501, and the high breakdown HBT structure 520 may be regrown on a second region 521 of the substrate 501. Alternatively, the high breakdown HBT structure 520 may be originally grown on a first region 511 of the substrate 501, and the high speed HBT structure 510 may be regrown on a second region 521 of the substrate 501.

Optionally, an insulating barrier 530 may be formed between the high speed HBT structure 510 and the high breakdown HBT structure 520. The insulating barrier 530 may shield the originally grown high speed HBT structure 410 during the regrowth of the high breakdown HBT structure 520, so as to prevent semiconductor sidewall growth of the high breakdown HBT structure 520 onto the originally grown high speed HBT structure 510.

Generally, the high speed HBT structure 510 may be similar to the high speed HBT structure 420, and the high breakdown HBT structure 520 may be similar to the high breakdown HBT structure 320. For example, the high speed HBT structure 510 may have a heavily doped collector layer 516, and it may be further processed to form a high speed HBT device. For another example, the high breakdown HBT structure 520 may have a lightly doped collector layer 526, and it may be further processed to form a high breakdown device.

On one hand, the high speed HBT structure 510 may have a higher cutoff frequency than the high breakdown HBT structure 520. In one embodiment, the current gain cutoff frequency of the high speed HBT structure 510 may, for example, be greater than about 300 GHz. In another embodiment, the current gain cutoff frequency of the high speed HBT structure 510 may, for example, be greater than about 500 GHz.

On the other hand, the high breakdown HBT structure 520 may have a higher breakdown voltage than the high speed HBT structure 510. In one embodiment, the breakdown voltage of the high breakdown HBT structure 520 may range, for example, from about 5 V to about 10 V. In another embodiment, the breakdown voltage of the high breakdown HBT structure 520 may approximately be 7.5 V.

The collector thickness 564 of the high breakdown HBT structure 520 may be greater than the collector thickness 554 of the high speed HBT structure by a collector thickness ratio. In one embodiment, the collector thickness ratio may range, for example, from about 1.5 to about 5. Moreover, the collector doping level of the high speed HBT structure 510 may be higher than the collector doping level of the high breakdown HBT structure 520 by a collector doping level ratio. Typically, the value of the collector doping level ratio may be determined by inversing the square root of the collector thickness ratio. In one embodiment, the collector doping level ratio may range, for example, from about 1.2 to about 2.2.

Moreover, the subcollector layer 512 may have a subcollector thickness 552 for compensating the collector thickness 554, and the subcollector layer 522 may have a subcollector thickness 562 for compensating the collector thickness 564. As a result, the combined device thicknesses 551 and 561 of the high speed and high breakdown HBT structures 510 and 520 may be kept constant. Advantageously, the combined device thickness 551 of the high speed HBT structure 510 may be substantially the same as the combined device thickness 561 of the high breakdown HBT structure 520.

As a person skilled in the art may readily appreciate, the absolute thickness of the collector layers of the high speed and high breakdown HBT devices may depend on the process limitation of the fabrication technology. For example, in an HBT process with 0.5 um emitter feature dimensions, the collector thickness of the high speed HBT device may be about 0.15 um, and the collector thickness of the high breakdown HBT device may be about 0.3 um. For another example, in an HBT process with 0.25 um emitter feature dimensions, the collector thickness of the high speed HBT device may be about 0.1 um and the collector thickness of the high breakdown HBT device may be about 0.2 um.

Figure 6:
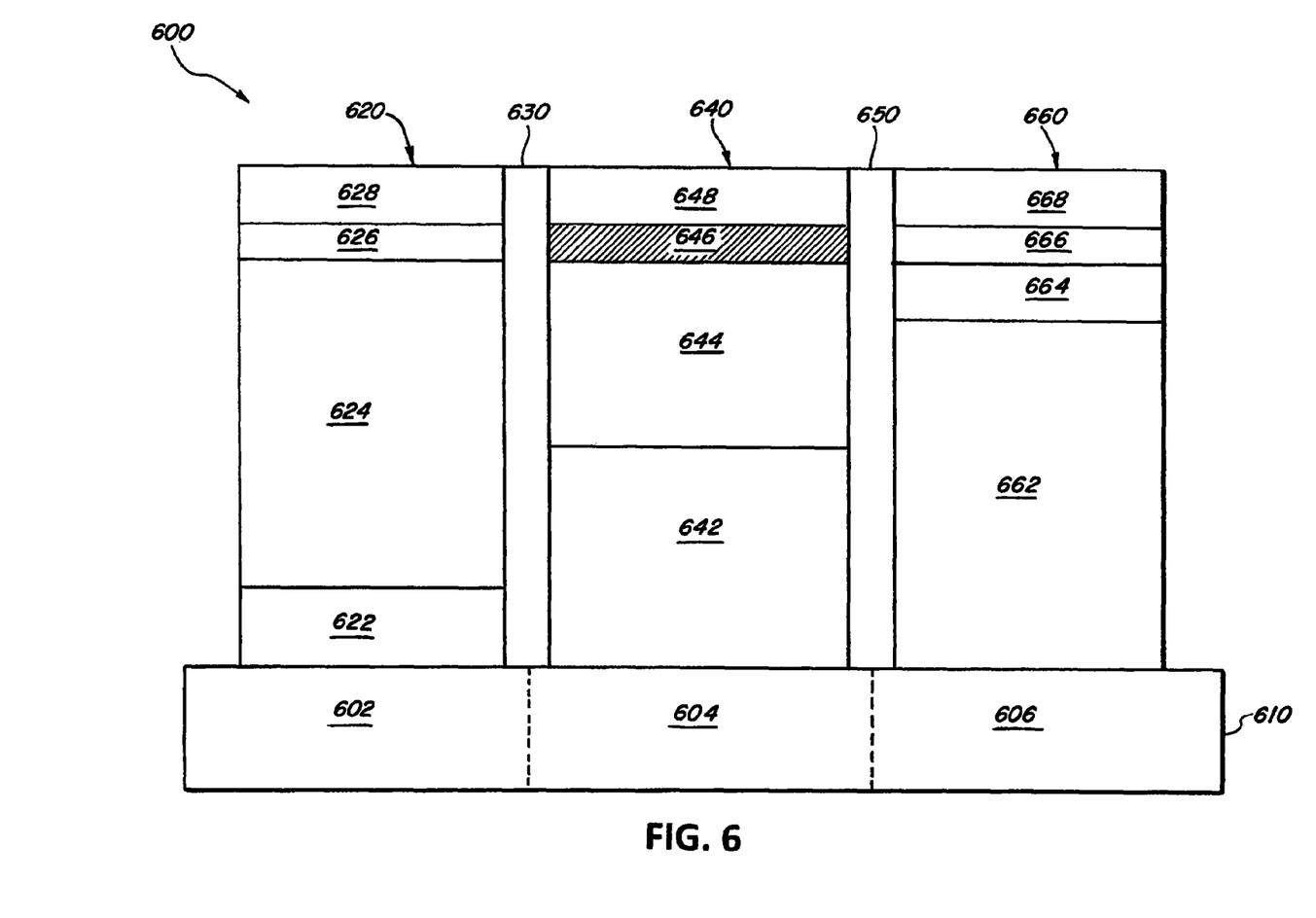
FIG. 6 shows a cross-sectional schematic view of an integrated device with a high breakdown HBT structure, a low noise HBT structure, and a high speed HBT structure according to an embodiment of the present invention.

In FIG. 6, a cross-sectional schematic view of an integrated device 600 with a high breakdown HBT structure 620, a low noise HBT structure 640, and a high speed HBT structure 660 is shown according to an embodiment of the present invention.

Generally, the high breakdown HBT structure 620 may be originally grown on a first region 602 of the substrate 610, the low noise HBT structure 640 may be regrown on a second region 604 of the substrate 610, and the high speed HBT structure 660 may be further regrown on a third region 606 of the substrate 610.

Optionally, a first insulating barrier 630 may be formed between the high breakdown HBT structure 620 and the low noise HBT structure 640, and a second insulating barrier 650 may be formed between the low noise HBT structure 640 and the high speed HBT structure 660. Particularly, the first insulating barrier 630 may shield the originally grown high breakdown HBT structure 620 during the regrowth of the low noise HBT structure 640, and the second insulating barrier 650 may shield the regrown low noise HBT structure 640 during the further regrowth of the high speed HBT structure 660.

As a person skilled in the art may readily appreciate, the sequential and spatial relationship among the high breakdown HBT structure 620, the low noise HBT structure 640, and the high speed HBT structure 660 is interchangeable. In one embodiment, for example, the low noise HBT structure 640 may be grown on the first region 602, the high speed HBT structure 660 may be regrown on the second region 604, and the high breakdown HBT structure 620 may be further regrown on the third region 606. In another embodiment, for example, the high speed HBT structure 660 may be grown on the third region 606, the high breakdown HBT structure 620 may be regrown on the first region 602, and the low noise HBT structure 640 may be further regrown on the second region 604.

The high breakdown HBT structure 620 may have subcollector, collector, base, and emitter layers 622, 624, 626, and

628. Specifically, the collector layer 624 may be relatively thick and lightly doped, such that the high breakdown HBT structure 620 may be further processed to form a high breakdown HBT device.

The low noise HBT structure 640 may have subcollector, collector, base, and emitter layers 642, 644, 646, and 648. Specifically, the base layer 646 of the low noise HBT structure 640 may have a relatively low doping level, such that it may be further processed to form a low noise HBT device with a relatively high current gain ($\beta$).

The high speed HBT structure 660 may have subcollector, collector, base, and emitter layers 662, 664, 666, and 668. Specifically, the collector layer 624 may be relatively thin and heavily doped, such that the high speed HBT structure 660 may be further processed to form a high speed HBT device.

Furthermore, the subcollector thicknesses of the subcollector layers 622, 642, 662 may be adjusted to compensate the respective collector thicknesses of the collector layers 624, 644, and 664. As a result, the combined device thicknesses of the high breakdown, low noise, and high speed HBT structures 620, 640, and 660 may be kept constant, and they may be substantially the same as one another.

Accordingly, the present invention may provide two or more HBT regrowth processes which may allow multiple HBT devices with various semiconducting properties to be formed on a single substrate. Advantageously, the two or more HBT regrowth processes may help integrate high breakdown, high speed, and low noise devices into a single chip, such that the amount of inter-chip routing and the area of a multi-functional circuit may be substantially reduced.

Figure 7:
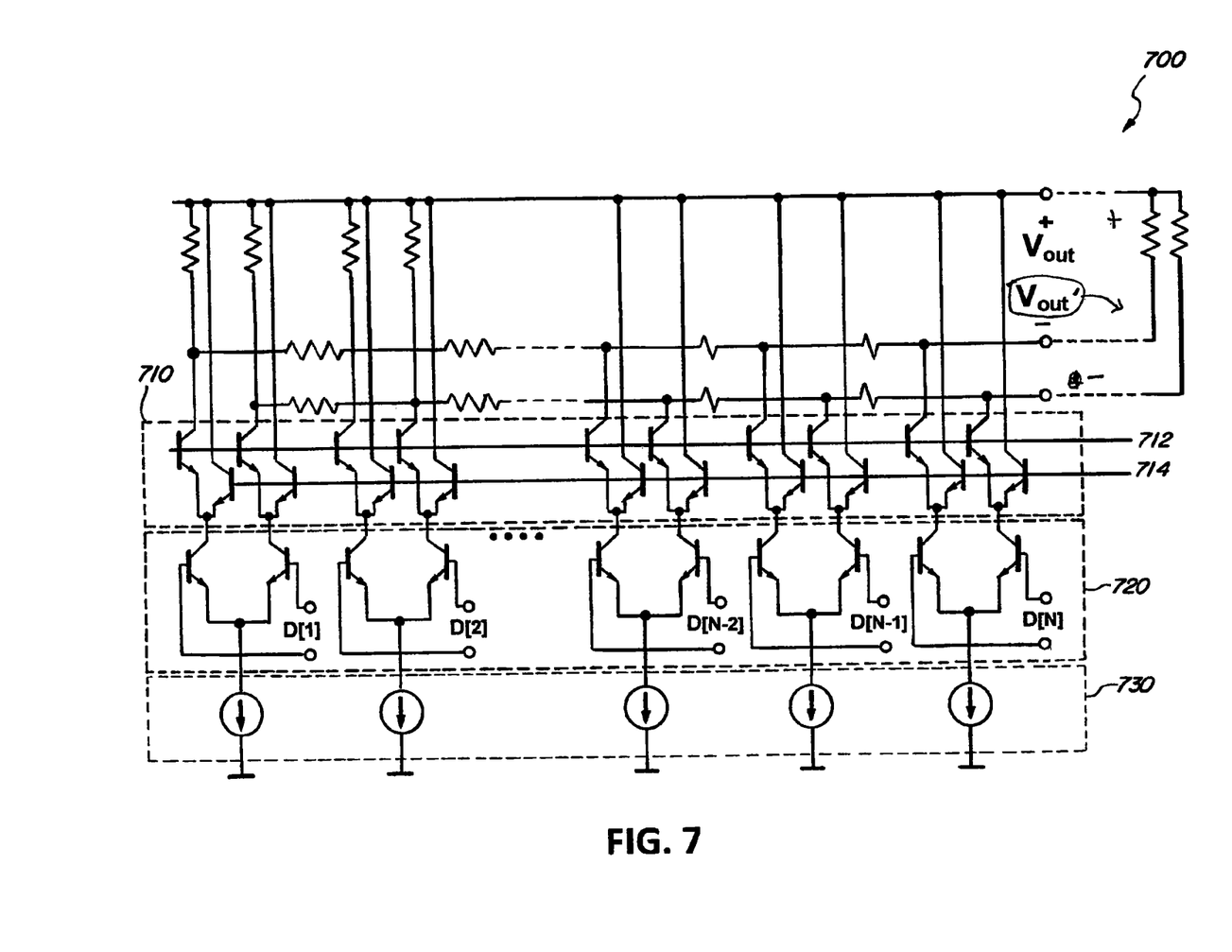
FIG. 7 shows a schematic view of a power digital-to-analog converter (DAC) integrated with high breakdown HBT devices and high speed HBT devices according to an embodiment of the present invention.

The discussion now turns to various single-chip integrated devices which may have one or more regrown HBT devices. FIG. 7 shows a schematic view of a power digital-to-analog converter (DAC) 700 integrated with high breakdown HBT devices and high speed HBT devices according to an embodiment of the present invention. The power DAC 700 may include a group of output devices 710, a group of switching devices 720, and a group of biased devices 730. Generally, the group of biased devices 730 may be a series of current sources, which may be responsible of providing a constant stream of large signal currents for biasing the power DAC 700.

The group of switching devices 720 may be controlled by digital signals D[0:N], and they may be turned on and off within a short period of time to direct the flow of output current, which may determine the polarity of the output voltage Vout (or Vout'). Because the values of digital signals D[0:N] may change in a relatively high frequency, which may range, for example, from about 5 GHz to about 60 GHz, it is desirable that the group of switching devices 720 may produce high speed digital outputs for fast switching. Accordingly, the group of switching devices 720 may be implemented by originally growing a group of high speed HBT devices as shown in FIG. 5.

The group of output device 710 may be controlled by a track signal 712 and a reset signal 714, and they may generate high swing output voltage Vout according to the outputs of the group of switching devices 720. Because the output voltage Vout may have a large voltage swing, which may range, for example, from about 2.5 V to about 10 V, it is desirable that the group of output devices 710 may withstand such large voltage swing and have a high breakdown voltage. Accordingly, the group of output devices 710 may be implemented by regrowing a group of high breakdown HBT devices as shown in FIG. 5.

Because the group of high breakdown HBT devices may be regrown on the same substrate as the group of originally grown high speed HBT devices, the power DAC 700 may enjoy several advantages. First, the power DAC 700 may have a routing parasitic reduction because the group of output devices 710 may be placed closer to the group of switching devices 720. Second, the power DAC 700 may have a size reduction because the group of output devices 710 and the group of switching devices 720 may be provided in one single chip. Third, the power DAC 700 may consume less energy because of the reduction of routing parasitic.

Figure 8:
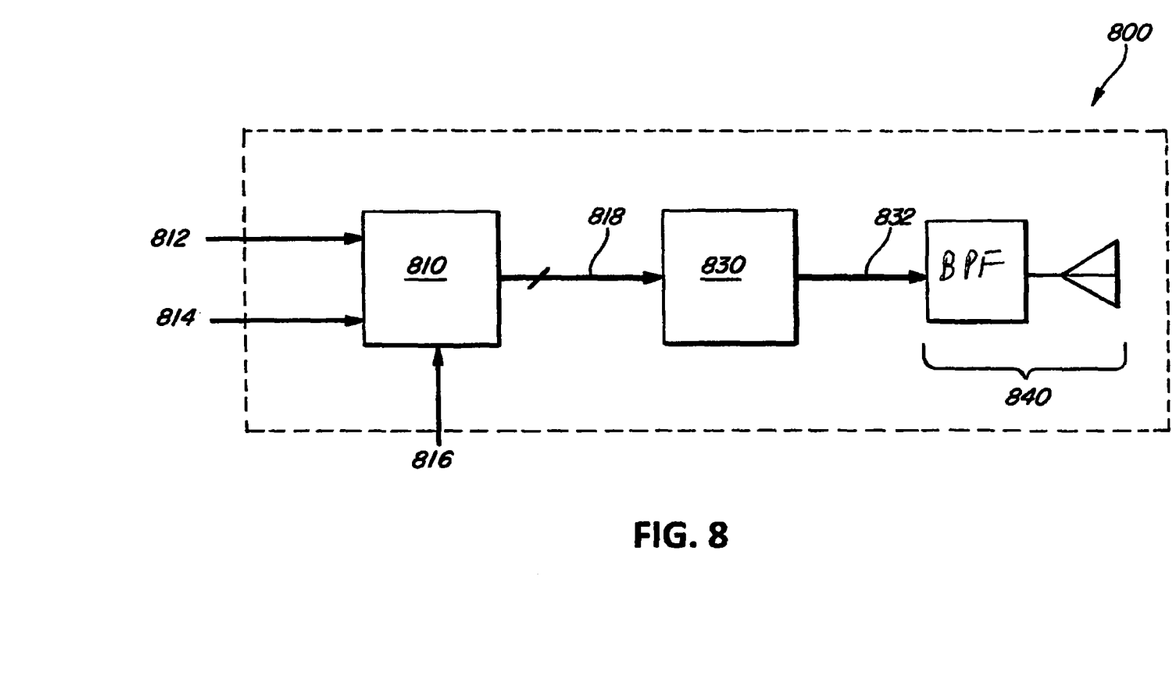
FIG. 8 shows a schematic view of a beamformer transceiver circuit integrated with high speed HBT devices and high breakdown HBT devices according to an embodiment of the present invention.

FIG. 8 shows a schematic view of a beamformer (BF) transceiver circuit 800 integrated with high speed HBT devices and high breakdown HBT devices according to an embodiment of the present invention. Generally, the beamformer transceiver circuit 800 may include a beamformer block 810, a power amplifier block 830, and an integrated filter-antenna block 840. The beamformer block 810 may receive a frequency reference signal 816, a baseband input signal 812, and a digital phase shift data signal 814 from a beam computer (not shown). In return, the beamformer block 810 may generate multiple element feed signals 818, which may have a BF frequency ranges from about 10 GHz to about 100 GHz. In order to perform high frequency processing, the beamformer block 810 may be implemented by growing high speed digital HBT devices.

The power amplifier block 830 may receive the multiple element feed signals 818, and in return, it may generate multiple amplified transmission signal 832. In order to perform high power amplification, the power amplifier block 830 may be implemented by regrowing high breakdown HBT devices on the same chip as the high speed digital HBT devices.

Figure 9:
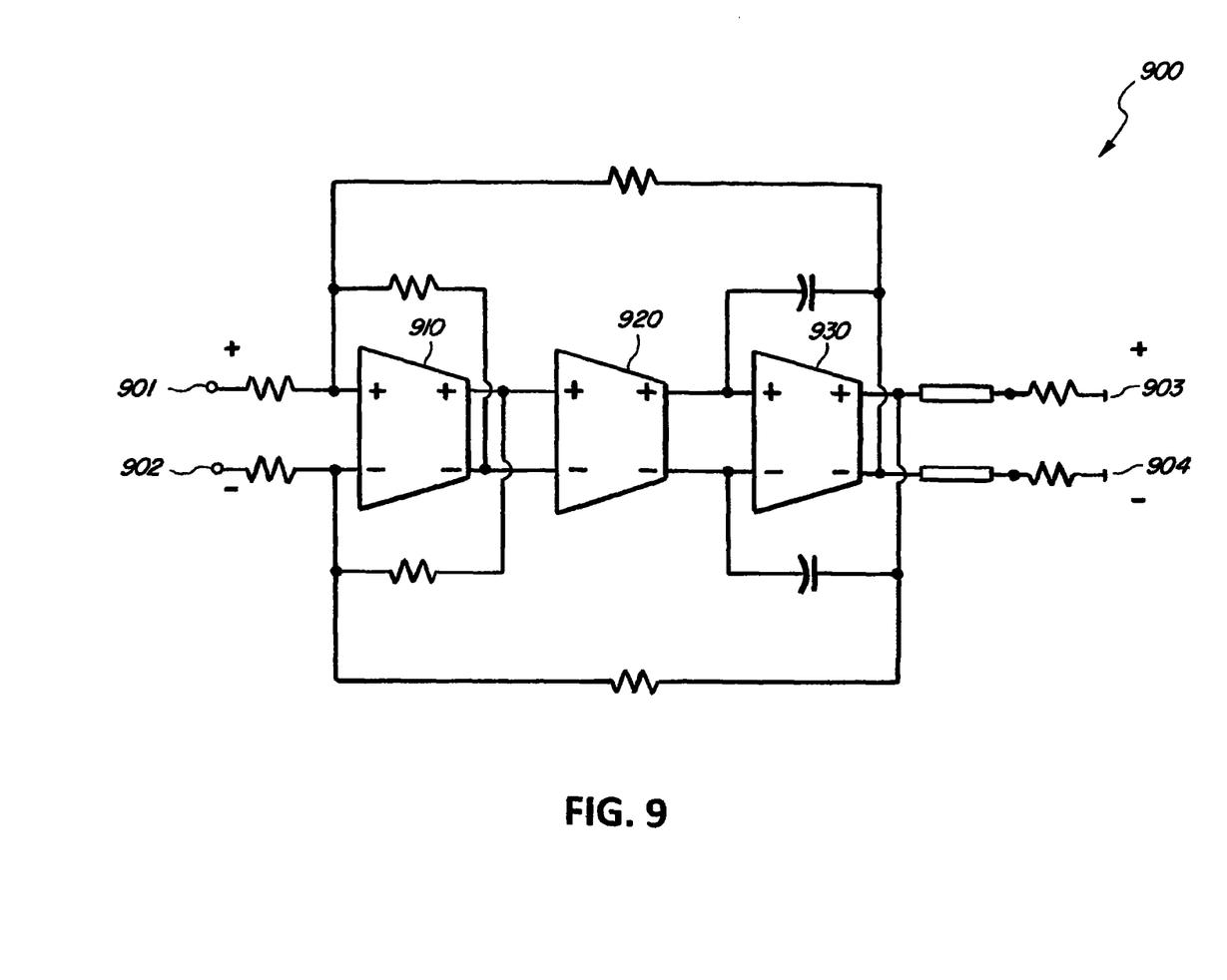
FIG. 9 shows a schematic view of a feedback linearized amplifier circuit integrated with low noise HBT devices, high speed HBT devices, and high breakdown HBT devices according to an embodiment of the present invention.

FIG. 9 shows a schematic view of a feedback linearized amplifier circuit 900 integrated with low noise HBT devices, high speed HBT devices, and high breakdown HBT devices according to an embodiment of the present invention. Generally, the feedback linearized amplifier circuit 900 may receive a pair of differential input voltages 901 and 902, and it may in return, generate a pair of differential output voltages 903 and 904.

Moreover, the feedback linearized amplifier circuit 900 may include a low noise input stage 910 for receiving the pair of differential input voltages 901 and 902, a high speed digital intermediate stage 920 for processing the received pair of differential input voltages 901 and 902, and a high breakdown output stage 930 for amplifying the processed pair of differential input voltages 901 and 902. Similar to the integrated device 600 as shown in FIG. 6, the feedback linearized amplifier circuit 900 may be fabricated by integrating one or more of the low noise, high speed, and high breakdown HBT devices on a single substrate.

In one embodiment, for example, the feedback linearized amplifier circuit 900 may be fabricated by first growing low noise HBT devices to realize the functions of the low noise input stage 910, regrowing high speed HBT devices to realize the functions of the high speed digital intermediate stage 920, and further regrowing high breakdown HBT devices to realize the functions of the high breakdown output stage 930.

In another embodiment, for example, the feedback linearized amplifier circuit 900 may be fabricated by first growing high breakdown HBT devices to realize the functions of the high breakdown output stage 930, regrowing low noise HBT devices to realize the functions of the low noise input stage 910, and further regrowing high speed HBT devices to realize the functions of the high speed digital intermediate stage 920.

Figure 10:
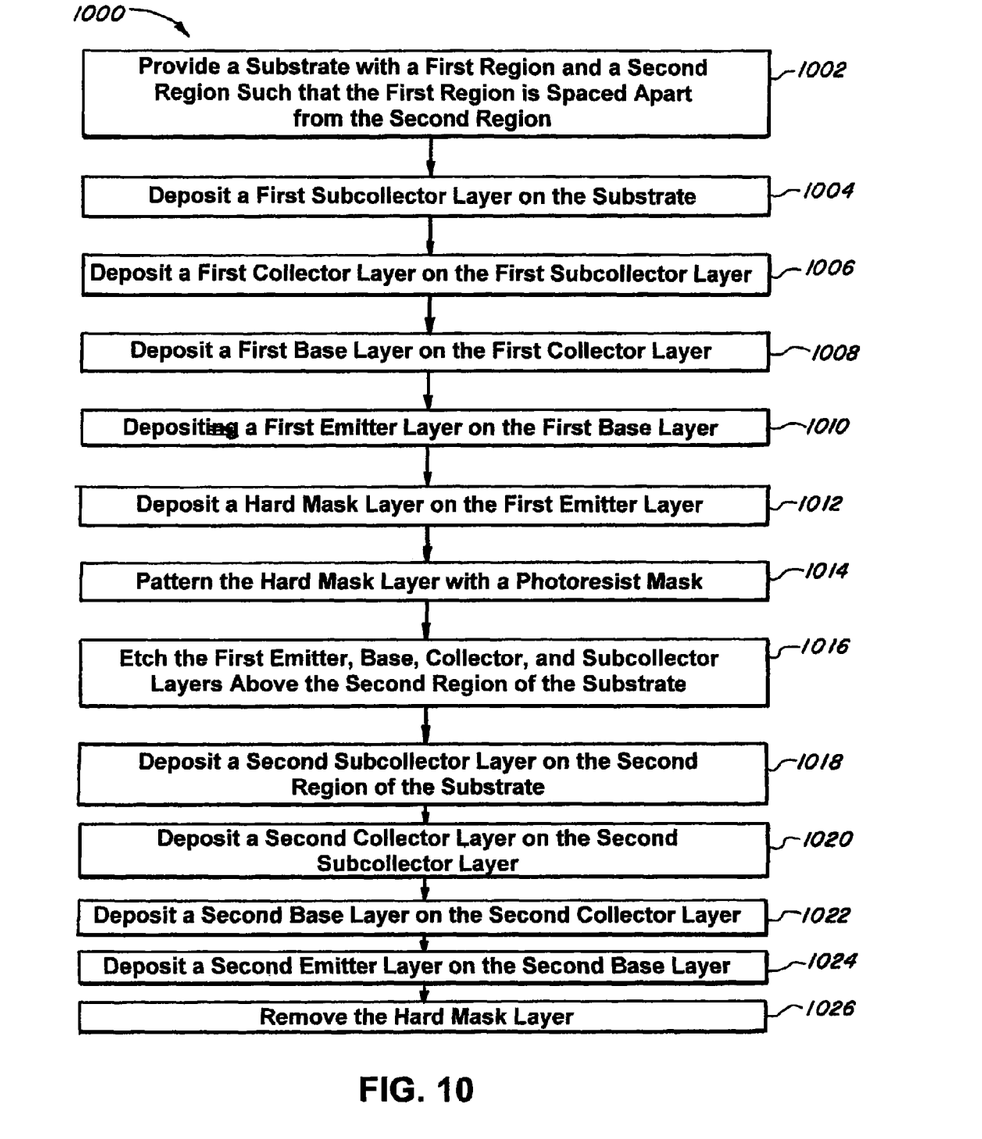
FIG. 10 shows a flow diagram of a method for fabricating an integrated device with a first HBT device and a regrown second HBT device according to an embodiment of the present invention.

FIG. 10 shows a flow diagram of a method 1000 for fabricating an integrated device with a first HBT device and a regrown second HBT device according to an embodiment of the present invention. In step 1002, a substrate with a first region and a second region may be provided. Particularly, the first region may be spaced apart from the second region, so that the first region may be used for growing the first HBT device and the second region may be used for regrowing the second HBT device.

In step 1004, a first subcollector layer may be deposited on the substrate. In step 1006, a first collector layer may be deposited on the first subcollector layer. Particularly, the first collector layer may have a first collector thickness and a first collector doping level, both of which may define the device characteristics of the first HBT device. In step 1008, a first base layer may be deposited on the first collector layer. In step 1010, a first emitter layer may be deposited on the first base layer. Particularly, the first base layer may have a first base doping level, which may determine whether the first HBT device may be used as a low noise HBT device. At this stage, the growth of a first HBT structure, which may be further processed to form the first HBT device, may be completed.

In step 1012, a hard mask layer may be deposited on the first emitter layer. In step 1014, the hard mask layer may be patterned with a photoresist mask, such that the hard mask layer may only cover and protect the first HBT structure that is grown on the first region of the substrate. In step 1016, the first emitter, base, collector, and subcollector layers above the second region of the substrate may be etched. At this stage, the second region of the substrate may be free of the first HBT structure, such that it may be ready for regrowing a second HBT structure. Optionally, an insulator barrier may be deposited along the junction first subcollector, collector, base, and emitter layers at the junction between the first and second region of the substrate.

In step 1018, a second subcollector layer may be deposited on the second region of the substrate. In step 1020, a second collector layer may be deposited on the second subcollector layer. Particularly, the second collector layer may have a second collector thickness and a second collector doping level, both of which may define the device characteristics of the second HBT device. In step 1022, a second base layer may be deposited on the second collector layer. Particularly, the second base layer may have a second base doping level, which may determine whether the second HBT device may be used as a low noise HBT device. In step 1024, a second emitter layer may be deposited on a second base layer. At this stage, the growth of the second HBT structure, which may be further processed to form the first HBT device, may be completed. In step 1026, the remaining hard mask layer may be removed.

After further processing, the first HBT structure may form the first HBT device, which may have a first device thickness, and the second HBT structure may form the second HBT device, which may have a second device thickness. In one embodiment, the first and second device thickness may be substantially equal to each other. Particularly, the second subcollector layer may be adjusted to compensate the difference between the second collector thickness and the first collector thickness. Moreover, the first and/or the second HBT devices may be used as one or more low noise device, high speed device, and high breakdown device.

In one embodiment, for example, the first HBT device may be a high speed device with a current gain cutoff frequency which may be greater than about 300 GHz, and the second HBT device may be a high breakdown device with a breakdown voltage which may be greater than about 5 V. Particularly, the second collector thickness may be about 1.5 times to about 5 times greater than the first collector thickness, whereas the first collector doping level may be about 1.2 times to about 2.2 times higher than the second collector doping level.

Furthermore, each of the first and second collector layers may contain one or more group III-V chemical compounds, which may include but not limited to gallium arsenide (GaAs), indium gallium arsenide (InGaAs), aluminum gallium arsenide (AlGaAs), indium gallium phosphide (InGaP), indium phosphide (InP), indium aluminum arsenide (InAlAs), indium arsenide (InAs), and/or gallium arsenide antimonide (GaAsSb).

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A method for fabricating an integrated device having a first heterojunction bipolar transistor (HBT) device formed on a first region of a substrate and a second HBT device formed on a second region of the substrate, the first region spaced apart from the second region, the method comprising:

depositing a first subcollector layer on the first region and the second region of the substrate to a first subcollector thickness;

depositing a first collector layer made of a first group III-V chemical compound above the first subcollector layer to a first collector thickness, the first collector layer having a first collector doping level in order to meet a first predetermined breakdown voltage and a first predetermined cut-off frequency of the first HBT device;

etching the first subcollector layer and the first collector layer above the second region of the substrate to create an opening that exposes the second region of the substrate;

depositing a second subcollector layer on the second region of the substrate to a second subcollector thickness that is different than the first subcollector thickness;

depositing a second collector layer made of a second group III-V chemical compound above the second subcollector layer to a second collector thickness that is different from the first collector thickness such that a sum of the first subcollector thickness and the first collector thickness is equal to a sum of the second subcollector thickness and the second collector thickness, the second collector layer having a second collector doping level in order to meet a second predetermined breakdown voltage and a second predetermined cut-off frequency of the second HBT device which are different from the first predetermined breakdown voltage and the first predetermined cut-off frequency of the first HBT device, the second collector layer occupying a portion of the opening, the second collector doping level being different from the first collector doping level;

etching the first collector layer and the first subcollector layer to define the first HBT device such that an entire bottom surface of the first collector layer contacts an entire top surface of the first subcollector layer; and etching the second collector layer and the second subcollector layer to define the second HBT device such that an entire bottom surface of the second collector layer contacts an entire top surface of the second subcollector layer.

2. The method of claim 1, wherein the second collector thickness is substantially greater than the first collector thickness, and the second collector doping level is lower than the first collector doping level.

3. The method of claim 1, wherein the first HBT device is a high speed device having a cutoff frequency greater than about 300 GHz, and the second HBT device is a high breakdown device having a breakdown voltage greater than about 5 V.

4. The method of claim 1, wherein the second collector thickness is about 1.5 times to about 5 times greater than the first collector thickness, and the first collector doping level is about 1.2 times to about 2.2 times higher than the second collector doping level.

5. The method of claim 1, wherein the first HBT device has a first device thickness and the second HBT device has a second device thickness, and wherein the first device thickness substantially equals the second device thickness.

6. The method of claim 1, wherein the first group III-V chemical compound and the second group III-V chemical compound are each selected from a group consisting of gallium arsenide (GaAs), indium gallium arsenide (InGaAs), aluminum gallium arsenide (AlGaAs), indium gallium phosphide (InGaP), indium phosphide (InP), indium aluminum arsenide (InAlAs), indium arsenide (InAs), gallium arsenide antimonide (GaAsSb), and combinations thereof.

7. The method of claim 1, further comprising the step of:
depositing an insulating barrier along a side of the first collector layer to shield the first collector layer during deposition of the second collector layer, leaving the second region of the substrate.

8. The method of claim 1, further comprising the steps of:
depositing a first base layer on the first collector layer, the first base layer having a first base doping level;
depositing a first emitter layer on the first base layer;
etching the first emitter, and base layers on or above the second region of the substrate;
depositing a second base layer on the second collector layer, the second base layer having a second base doping level; and
depositing a second emitter layer on the first base layer, such that the second and first emitter layers are aligned to a common plane.

9. The method of claim 8, wherein the second base doping level is higher than the first base doping level.

10. The method of claim 1, wherein the first HBT device is a low noise device having beta gain greater than about 40 and the second HBT device includes a device selected from a group consisting of a high breakdown device having a breakdown voltage greater than about 5 V, a high speed device having a cutoff frequency of about 300 GHz, and combinations thereof.

11. The method of claim 8, wherein the first base layer has a first current gain value and the second base layer has a second current gain value, and wherein the first current gain value is larger than the second current gain value.

12. The method of claim 9, wherein the first HBT device has a first device thickness and the second HBT device has a second device thickness, and wherein the first device thickness substantially equals the second device thickness.

13. The method of claim 9, wherein the first group III-V chemical compound and the second group III-V chemical compound are selected from a group consisting of gallium arsenide (GaAs), indium gallium arsenide (InGaAs), aluminum gallium arsenide (AlGaAs), indium gallium phosphide (InGaP), indium phosphide (InP), indium aluminum arsenide (InAlAs), indium arsenide (InAs), gallium arsenide antimonide (GaAsSb), and combinations thereof.

14. The method of claim 1, further comprising the step of depositing an insulating barrier along a side of the first HBT device to shield the first HBT device during a deposition of the second HBT device.

15. The method of claim 9, wherein the second collector doping level is different from the first collector doping level.

16. A method for fabricating an integrated device having a first heterojunction bipolar transistor (HBT) device formed on a first region of a substrate and a second HBT device formed on a second region of the substrate, the first region spaced apart from the second region, the method comprising:
depositing a first subcollector layer on the first and second regions of the substrate to a first subcollector thickness;
depositing a first collector layer above the first subcollector layer to a first collector thickness, the first collector layer having a first collector doping level;
etching the first subcollector layer and the first collector layer above the second region of the substrate to create an opening that exposes the second region of the substrate;
depositing an insulating barrier along a side of the first subcollector layer and the first collector layer to shield the first subcollector layer and the first collector layer during further deposition, leaving the second region of the substrate open;
depositing a second subcollector layer on the second region of the substrate to a second subcollector thickness, the second subcollector thickness being different from the first subcollector thickness;
depositing a second collector layer above the second subcollector layer to a second collector thickness, the second collector layer occupying a portion of the opening, the second collector layer having a second collector doping level, the second collector thickness being different from the first collector thickness such that a thickness of the second collector layer and the second subcollector layer together is substantially equal to a thickness of the first collector layer and the first subcollector layer together;
etching the insulating barrier to create a second opening between the first HBT device and the second HBT device;
etching the first collector layer and the first subcollector layer to define the first HBT device such that an entire bottom surface of the first collector layer contacts the entire top surface of the first subcollector layer; and
etching the second collector layer and the second subcollector layer to define the second HBT device such that an entire bottom surface of the second collector layer contacts the entire top surface of the second subcollector layer.

* * * * *